United States Patent
Li

(10) Patent No.: US 8,593,777 B1
(45) Date of Patent: Nov. 26, 2013

(54) USER-ACTUATED BUTTON ESD PROTECTION CIRCUIT WITH SPARK GAP

(75) Inventor: Xingqun Li, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/470,196

(22) Filed: May 11, 2012

(51) Int. Cl.
*H02H 1/00* (2006.01)

(52) U.S. Cl.
USPC ............. 361/212; 361/56; 361/91.1; 361/111

(58) Field of Classification Search
None
See application file for complete search history.

(56) References Cited

U.S. PATENT DOCUMENTS

| | | | |
|---|---|---|---|
| 3,590,319 A * | 6/1971 | Baltensperger | 361/8 |
| 4,072,998 A | 2/1978 | Schei | |
| 4,586,105 A * | 4/1986 | Lippmann et al. | 361/117 |
| 5,063,474 A * | 11/1991 | Igarashi | 361/220 |
| 5,289,335 A | 2/1994 | Kato | |
| 6,215,251 B1 | 4/2001 | Orchard-Webb | |
| 6,696,823 B2 * | 2/2004 | Ledenev et al. | 323/272 |
| 6,866,353 B2 | 3/2005 | Wertsberger | |

FOREIGN PATENT DOCUMENTS

| | | |
|---|---|---|
| DE | 3600735 | 7/1987 |
| DE | 10259035 | 7/2004 |

* cited by examiner

*Primary Examiner* — Jared Fureman
*Assistant Examiner* — Terrence Willoughby
(74) *Attorney, Agent, or Firm* — Blakely, Sokoloff, Taylor & Zafman LLP

(57) ABSTRACT

A consumer electronic device including an electronic circuit designed to protect a user-actuated physical button from becoming degraded due to electrostatic discharges (ESD) strikes is described herein. The device includes a housing and the user-actuated physical button is exposed through the external surface of the housing. The device further includes a mechanical switch that is coupled to the physical button and a first resistor that is electrically coupled with a pair of terminals of the switch. The first resistor may be coupled either in series or in parallel with the terminals of the switch. To protect the first resistor from ESD strikes, a first spark gap is coupled in parallel with the first resistor. The device may also include a buffer circuit that is coupled to the switch. Other embodiments are also described.

18 Claims, 4 Drawing Sheets

FOOTPRINT PATTERN 1    FOOTPRINT PATTERN 2

USER-ACTUATED BUTTON ESD PROTECTION CIRCUIT WITH SPARK GAP

FIELD

An embodiment of the invention relate generally to a consumer electronic device having an electronic circuit with a spark gap to protect the device's user-actuated physical button from degradation caused by electrostatic discharges (ESD).

BACKGROUND

One form of electrostatic discharge (ESD) is the ESD spark. The ESD spark occurs when a heavy electric field creates an ionized conductive channel in the air. For example, such ESD sparks may be created when handling electronic equipment. While the ESD sparks only causes mild discomfort to a person receiving the discharge, the ESD sparks may cause damage to integrated circuits within the electronic equipment. When subjected to repeated ESD strikes, circuit elements may significantly degrade over time and eventually suffer permanent damage. For instance, the resistance of a resistor element greatly increases with every ESD strike. Accordingly, the electronic circuits may not function as intended when the properties of the elements included in the circuit vary over time. Thus, ESD strikes are a threat to the reliability and performance of electronic devices.

SUMMARY

In one embodiment of the invention, a consumer electronic device includes an electronic circuit designed to protect a user-actuated physical button from becoming degraded due to an electrostatic discharge (ESD). The consumer electronics device may include a housing that has a user-actuated physical button exposed through an external surface of the housing. The device further includes a mechanical switch that is coupled to the physical button, a first resistor that is electrically coupled with a pair of terminals of the switch, and a buffer circuit that is coupled to the switch. The first resistor may be coupled either in series or in parallel with the terminals of the switch. To protect the first resistor from ESD strikes, a first spark gap that allows the signals having a high frequency and high voltage (e.g., ESD strikes) to pass and does not allow signals having a low frequency and low voltage (e.g., signals from the mechanical switch) to pass may be coupled in parallel to the first resistor. In this configuration, the first spark gap may protect the first resistor from degrading by preventing the ESD strikes from passing through the first resistor. In some embodiments, the first spark gap may be directly connected to the first resistor and the first resistor may be directly connected to at least one of the terminals of the switch. In some embodiments, the buffer circuit processes a signal that varies based on the switch being closed or open. The switch may be closed when the user-actuated physical button is actuated and may be open when the user-actuated physical button is not actuated. The buffer circuit may also transmit the processed signal to a processor or a system on a chip (SOC) that detects whether the switch is open or closed based on the processed signal received from the buffer circuit.

In another embodiment of the invention, an electronic circuit is designed to protect a physical button from becoming degraded due to an electrostatic discharge (ESD). The electronic circuit comprises a mechanical switch that is coupled to a physical button and that includes a pair of terminals, a first resistor that is electrically coupled either in series or in parallel with the terminals of the switch, and a buffer circuit electrically coupled to the switch. The first resistor may include a discrete surface mount resistor package that is soldered to a pair of pads in a top metal layer of a printed circuit board. The circuit may also include a first spark gap that is coupled in parallel with the first resistor to protect the first resistor from ESD strikes. The first spark gap may include a pair of conductive footprints patterned in the top metal layer and directly connected to the pair of pads in the top metal layer, respectively. The circuit may also include a DC power supply that is coupled to the first resistor and that provides less than 2 volt output voltage. In some embodiments, the circuit may further include a second resistor that is electrically coupled in series between the switch and ground, and a second spark gap that is coupled in parallel with the second resistor to protect the second resistor from ESD strikes.

The above summary does not include an exhaustive list of all aspects of the present invention. It is contemplated that the invention includes all systems, apparatuses and methods that can be practiced from all suitable combinations of the various aspects summarized above, as well as those disclosed in the Detailed Description below and particularly pointed out in the claims filed with the application. Such combinations may have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. In the drawings.

DETAILED DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

Figure 1:
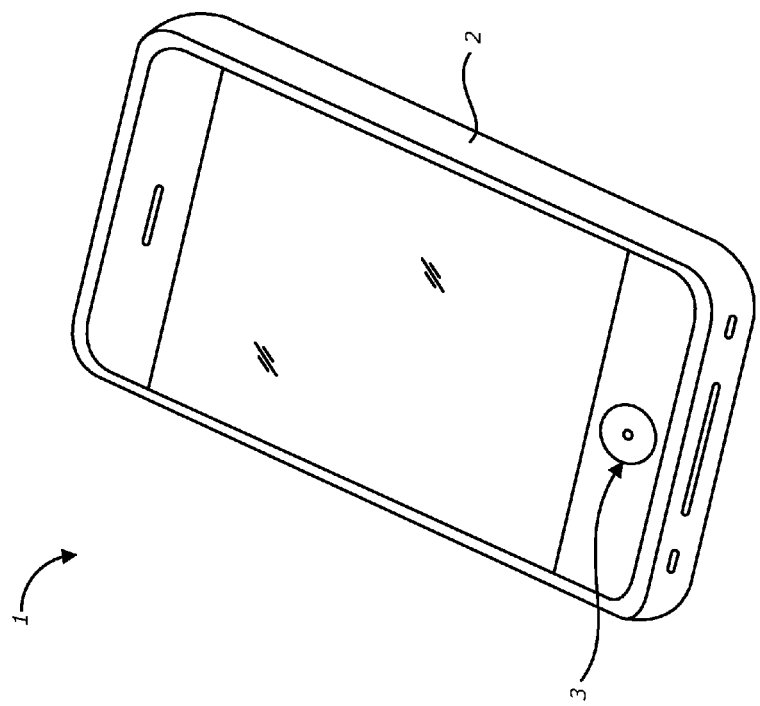
FIG. 1 illustrates one example of a consumer electronic device in which an embodiment of the invention may be implemented.

FIG. 1 illustrates one instance of a portable consumer electronic device (or "mobile device") in which an embodiment of the invention may be implemented. As shown in FIG. 1, the mobile device 1 may be a mobile telephone communications device or a smartphone such as an iPhone™ device, from Apple Inc. of Cupertino, Calif. The mobile device 1 may also be a tablet computer such as an iPad™ device, or a personal digital media player such an iPod™ device, which are all from Apple Inc. of Cupertino, Calif. While FIG. 1 illustrates a mobile device 1, it is understood that embodiments of the invention may also be implemented in a non-mobile device such as a compact desktop computer such as an iMac™, from Apple Inc. of Cupertino, Calif. The device housing 2 (also referred to as the external housing) encloses a plurality of electronic components of the device 1. For example, the device 1 may include electronic components such as a processor, a data storage containing an operating system and application software for execution by the processor, and input-output devices such as a display screen which may be a touch screen, and physical buttons. As shown in FIG. 1, physical buttons of the mobile device 1 may include a user-actuated physical button 3 that is a movable button member that is exposed through an external surface of the housing 2. A user of the mobile device 1 may supply input commands by actuating the button 3. For example, the button 3 may be a menu button.

Figure 2:
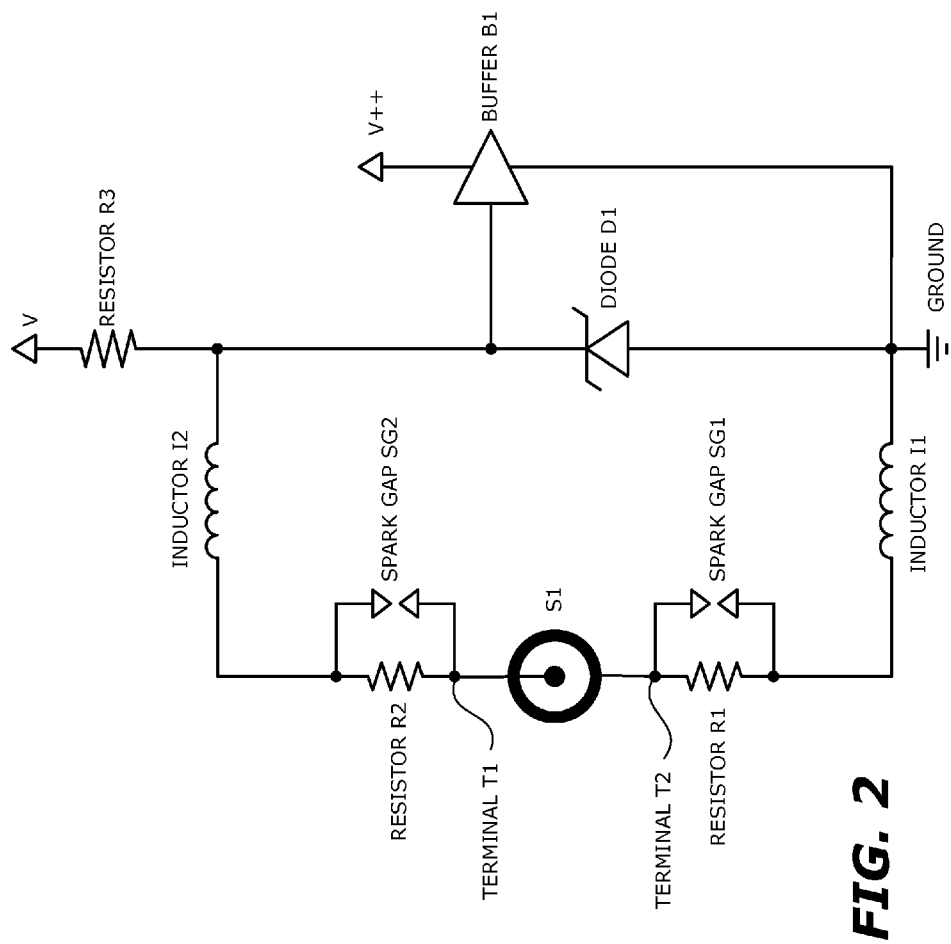
FIG. 2 shows an electronic circuit included in a consumer electronic device according to one embodiment of the invention.

In one embodiment, the button 3 may be coupled to a mechanical switch that is used to provide electronic switching capabilities. Referring to FIG. 2, the mechanical switch S1 is illustrated in an electronic circuit included in the consumer electronic device 1 according to one embodiment of the invention. For example, when the button 3 is actuated by a user (i.e., actuated position), the mechanical switch S1 is closed and when the button 3 is not actuated by a user (i.e., unactuated position), the mechanical switch S1 remains open. The mechanical switch S1 may include at least two contacts that are electrically connected when the switch S1 is closed, and are electrically disconnected when the switch S1 is open. In some embodiments, the switch S1 may include an inverted dome with a base and a conductive underside. The base of the inverted dome may be attached to the button 3 that includes electrical contacts facing the conductive underside of the inverted dome. The electrical contacts may include an inner contact and an outer contact. When the button 3 is in an actuated position, the inverted dome may be compressed such that the conductive underside of the inverted dome comes into contact with the electrical contacts. In an actuated position, the inner contact and the outer contact are electrically connected such that the switch S1 is closed to form a closed path between inductors L1 and L2 via the switch S1. When the button 3 is in the unactuated position, the conductive underside of the inverted dome does not come into contact with the electrical contacts such that the inner and outer contacts are electrically disconnected from one another. In this unactuated position, the switch S1 is open and an open circuit is formed between inductors L1 and L2 via the switch S1.

The electronic circuit included in the consumer electronic device 1 as shown in FIG. 2 provides a signal to a processor or a system on a chip (SOC) that detects whether the button 3 has been actuated based on the signal. The processor may be a computer processing unit (CPU). In some embodiments, the processor or the SOC may be executing button actuation detection software. Since the user interacts with the mobile device 1 via the button 3, the button 3 is a site where ESD strikes may likely occur. Repeated exposure to ESD strikes may cause the degradation of the internal components that affect the function of button 3. Accordingly, FIG. 2 illustrates one embodiment of a circuit that protects electronic components therein from ESD strikes that originate from the button 3.

As shown in FIG. 2, the electronic circuit comprises the mechanical switch S1 that is coupled the physical button 3, resistors R1, R2, and R3, spark gaps SG1 and SG2, inductors L1 and L2, a diode D1, a buffer circuit B1 and a power supply V. In the embodiment shown in FIG. 2, the terminals T1, T2 of the switch S1 are coupled to resistor R1 and resistor R2, respectively. While FIG. 2 illustrates an embodiment where the resistors R1 and R2 are electrically coupled in series with the terminals of the switch S1, it is contemplated that the resistors R1, R2 may also be electrically coupled in parallel with the terminals of the switch S1.

In one embodiment, the resistors R1 and R2 may have resistance values that are relatively low (e.g., 6 k ohms) while the resistor R3 may be a relatively higher resistance value (e.g., 300 k ohms). In this embodiment, the resistors R1 and R2 may be used primarily for antenna isolation purposes. As shown in FIG. 2, the resistor R1 may be connected in series with the inductor L1 and ground, and the resistor R2 may be connected in series to inductor L2, resistor R3, and the power supply V. In this embodiment, the resistor R1 is coupled in series between the switch S1 and ground while the resistor R2 is coupled in series between the switch S1 and the power supply V. The power supply V may be, for example, a DC power supply that provides less than a 2 volt output voltage. In some embodiments, the power supply V may also be electrically coupled to a memory (e.g. SDRAM).

The buffer circuit B1 may be a digital buffer that processes the signal from the switch S1 and transmits the processed signal to the processor or the SOC. In some embodiments, processing by the digital buffer includes cleaning and reproducing the received signal (e.g., non-inverting buffer). In other embodiments, the buffer circuit B1 may be a low-power dual buffer with open-drain output that is configured to provide two non-inverting buffers with open-drain output. The buffer circuit B1 may process (or clean) the received signal to ensure that the processed signal output can clearly be detected by the processor or the SOC as being logic "high" or "low." In FIG. 2, when the button 3 is unactuated, the circuit is open at the switch S1 and the signal being output from the buffer circuit B1 may be logic high because the power supply V pulls the signal inputted to the buffer circuit B1 "up." Further, as illustrated in FIG. 2, the input of buffer circuit B1 is coupled to the diode D1 and a node between resistor R3 and inductor L2. In this configuration, when the button 3 is in the unactuated position, the diode D1 may be configured to prevent the current from travelling from the node between resistor R3 and the inductor L2 to ground such that the input of buffer circuit B1 reads as logic "high." In FIG. 2, when button 3 is actuated, the circuit is closed at switch S1 and the signal being output from the buffer circuit B1 may be logic "low" because the signal inputted to the buffer circuit B1 is being pulled "down" to ground.

When the button 3 is actuated by the user and an ESD strike occurs, the ESD strike may pass through the resistors R1 and R2, causing the resistors R1 and R2 to degrade over time. Repeated ESD strikes may cause the resistance of the resistors R1 and R2 to increase over time and permanently damage the resistors R1 and R2. If, for example, the resistance of resistor R2 is greatly increased, the voltage of the signal being received by the buffer circuit B1 cannot be pulled down when the button 3 is actuated. In other words, the resistance of the path via the damaged resistor R2 and closed switch S1 to ground remains too high. Accordingly, the damaged resistor R2 will cause the actuation of the button 3 not to be detected by the processor or SOC because the processed signal outputted from buffer circuit B1 will be read as logic "high" despite the button 3 being actuated to close the path at switch S1.

Figure 4:
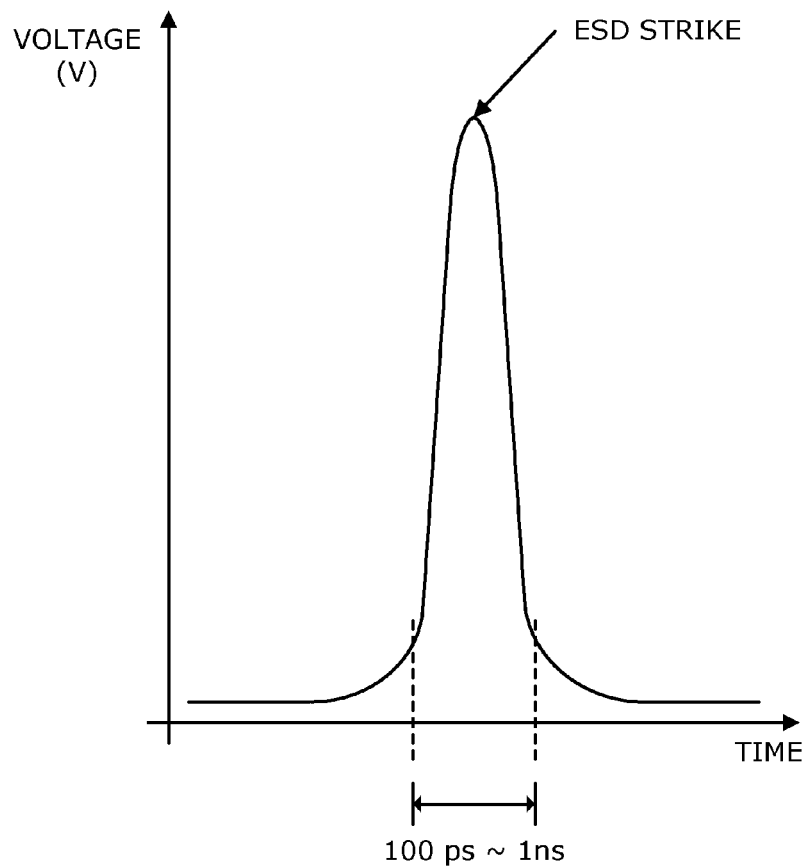
FIG. 4 shows a graph that illustrates the voltage (V) of an electrostatic discharge (ESD) over time (t).

In order to protect the resistors R1 and R2 from degrading due to ESD strikes, spark gaps SG1 and SG2 may be coupled in parallel to the resistors R1 and R2, respectively. The spark gaps SG1 and SG2, respectively, may also be directly connected in parallel to the resistors R1 and R2 (See FIG. 2). In one embodiment, spark gaps SG1 and SG2 may comprise a pair of conducting electrodes or pads separated by a space. Spark gaps SG1 and SG2 may be configured to pass signals having a high frequency and high voltage, and not to pass signals having a low frequency and low voltage. As shown in FIG. 4, which illustrates the voltage of an ESD over time in a graph, the ESD strike is a signal that has a high frequency and high voltage. In contrast, the signals having low frequency and low voltage include signals from the mechanical switch S1. In the configuration illustrated in FIG. 2, the spark gaps SG1 and SG2 provide an additional channel for the ESD strikes such that the ESD strikes are passed through the spark gaps SG1 and SG2 instead of the resistors R1 and R2, respectively. Thus, the addition of the spark gaps SG1 and SG2 protect the resistors R1 and R2 from the damage caused by ESD strikes. Additionally, since the spark gaps SG1 and SG2 may be configured to not pass signals that have a low frequency and low voltage (e.g., signals from the switch S1), the resistors R1 and R2 are not shorted out of the circuit in FIG. 2. Instead, the resistors R1 and R2 are still able to pass signals from the switch S1 and thus, the circuit in FIG. 2 may be used to provide a processed signal to a processor or SOC that detects whether the button 3 has been actuated based on the processed signal.

As shown in FIG. 2, when an ESD strike occurs at button 3, the inductors L1 and L2, which are used for antenna isolation, receive the ESD strikes that pass through the spark gaps SP1 and SP2, respectively. In some embodiments, the inductors L1 and L2 may be a larger sized surface mount (e.g., 0603 package) in relation to the surface mount size of the resistors R1 and R2 (e.g., 0201 package). Accordingly, the inductors L1 and L2, as a larger size package, may not be damaged by the high energy of the ESD strike. Further, since the inductor L2 is coupled in series between the switch S1 and the resistor R3, the inductor L2 may also protect the resistor R3 from being damaged by the ESD strike originating from the switch S1.

Figure 3:
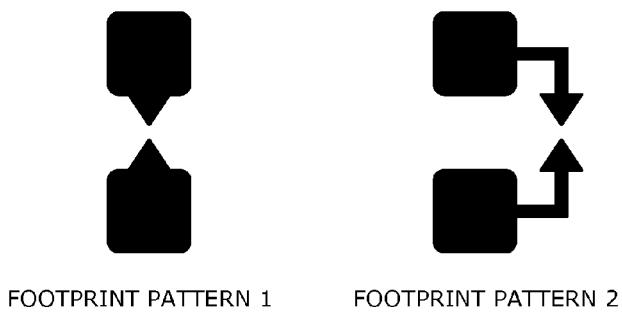
FIG. 3 illustrates exemplary spark gap footprint patterns included in an electronic circuit according to one embodiment of the invention.

In one embodiment, each of the resistors R1 and R2 may include a discrete surface mount resistor package soldered to a pair of pads in a top metal layer of a printed circuit board. The discrete surface mount resistor package may be a small sized surface mount, low voltage resistor (e.g., 0201 package). In this embodiment, each of the spark gaps SG1 and SG2 may include a pair of conductive footprints that is patterned in the top metal layer of the printed circuit board and are directly connected to the pair of pads in the top metal layer, respectively. The pair of conductive footprints of the spark gaps SG1 and SG2 may be wired in parallel with the discrete surface mount resistor package. FIG. 3 illustrates exemplary spark gap footprint patterns for spark gap SG1 and SG2 included in the electronic circuit according to one embodiment of the invention.

Figure 5:
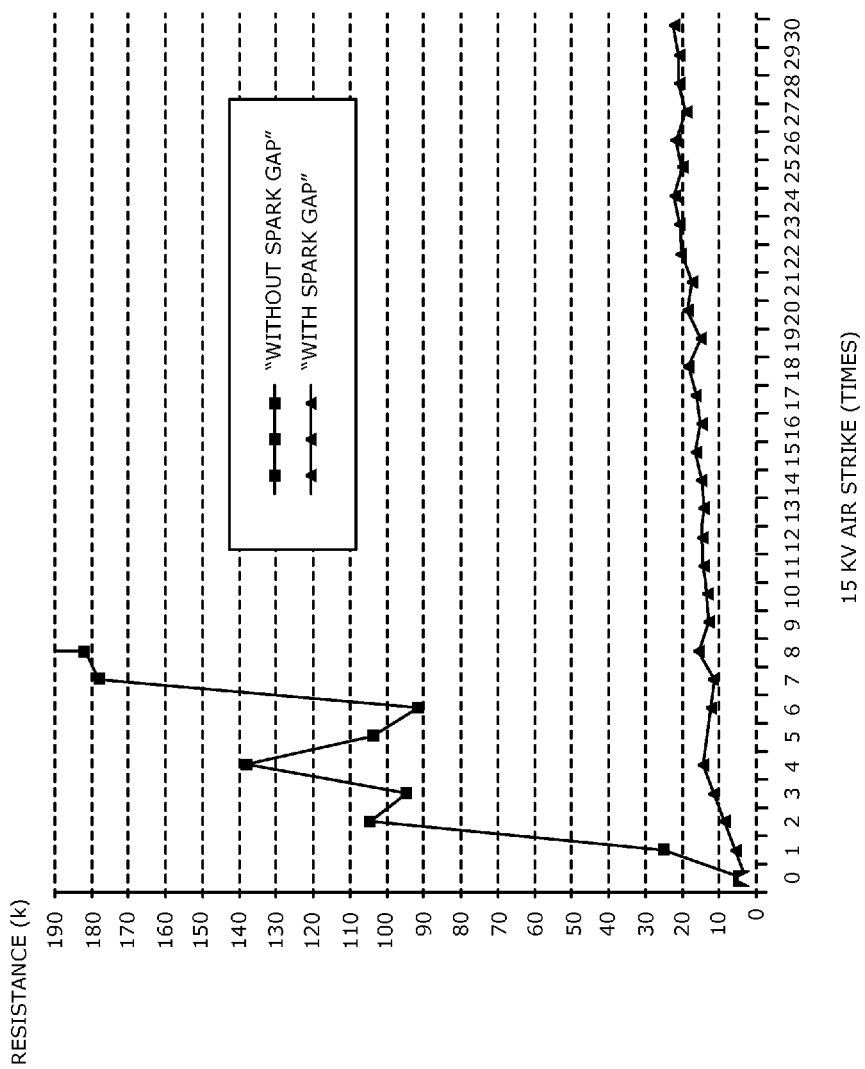
FIG. 5 shows a graph that illustrates the effects of repeated ESD strikes on the resistance of resistors R1 and R2.

FIG. 5 shows a graph that illustrates the effects of repeated ESD strikes on the resistance of resistors R1 and R2. Specifically, the resistance of resistors R1 and R2 in a circuit without the spark gaps SP1 and SP2 and the resistance of resistors R1 and R2 in a circuit including the spark gaps SP1 and SP2 (See FIG. 2) are contrasted in FIG. 5. The resistors R1 and R2 in FIG. 5 are initially 6 k ohm resistors. As clearly shown, the resistance of resistors R1 and R2 is greatly increased after only two ESD strikes to about 105 k ohms. In contrast, with the addition of the spark gaps SP1 and SP2 coupled in parallel with the resistors R1 and R2, the resistance of resistors R1 and R2 after two ESD strikes appears to remain between 6 k ohms and 9 k ohms.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting. There are numerous other variations to different aspects of the invention described above, which in the interest of conciseness have not been provided in detail. Accordingly, other embodiments are within the scope of the claims.

The invention claimed is:

1. A consumer electronic device comprising:
   a housing;
   a user-actuated physical button exposed through an external surface of the housing;
   a mechanical switch coupled to the physical button, the switch having a pair of terminals;
   a first resistor being electrically coupled either in series or in parallel with the terminals of the switch;
   a first spark gap coupled in parallel with the first resistor; and
   a buffer circuit that is coupled to the switch, wherein the buffer circuit processes a signal that varies based on the switch being closed or open, and wherein the switch is closed when the user-actuated physical button is actuated and is open when the user-actuated physical button is not actuated.

2. The device of claim 1, further comprising:
   a DC power supply, wherein the first resistor is coupled to the power supply either in series between the power supply and the switch, or in parallel with the switch.

3. The device of claim 1, wherein
   the first resistor comprises a discrete surface mount resistor package soldered to a pair of pads in a top metal layer of a printed circuit board, and
   the first spark gap includes a pair of conductive footprints patterned in the top metal layer and directly connected to the pair of pads in the top metal layer, respectively.

4. The device of claim 1, wherein the first spark gap passes signals having a high frequency and high voltage, and does not pass signals having a low frequency and low voltage.

5. The device of claim 4, wherein the signals having the high frequency and high voltage include an electrostatic discharge (ESD) strike and the signals having the low frequency and low voltage include signals from the switch.

6. The device of claim 1, wherein the first spark gap is directly connected to the first resistor.

7. The device of claim 2, wherein the first resistor is directly connected to at least one of the terminals of the switch.

8. The device of claim 1, wherein the buffer circuit further transmits the processed signal to a processor or a system on a chip (SOC) that detects whether the user-actuated physical button is actuated based on the processed signal.

9. A consumer electronic device comprising:
   a housing;
   a user-actuated physical button exposed through an external surface of the housing;
   a mechanical switch coupled to the physical button, the switch having a pair of terminals;
   a first resistor being electrically coupled either in series or in parallel with the terminals of the switch;
   a first spark gap coupled in parallel with the first resistor;
   a DC power supply, wherein the first resistor is coupled to the power supply either in series between the power supply and the switch, or in parallel with the switch;
   a second resistor being electrically coupled in series between the terminals of the switch and ground, wherein the first resistor is coupled in series between the power supply and the switch; and a second spark gap coupled in parallel with the second resistor.

10. A electronic circuit comprising
a mechanical switch coupled to a physical button, the switch having a pair of terminals;
a first resistor being electrically coupled either in series or in parallel with the terminals of the switch;
a first spark gap coupled in parallel with the first resistor; and
a buffer circuit that is coupled to the switch, wherein the buffer circuit processes a signal that varies based on the switch being closed or open.

11. The electronic circuit of claim 10, further comprising:
a DC power supply, wherein the first resistor is coupled to the power supply either in series between the power supply and the switch, or in parallel with the switch.

12. The electronic circuit of claim 10, wherein
the first resistor comprises a discrete surface mount resistor package soldered to a pair of pads in a top metal layer of a printed circuit board, and
the first spark gap includes a pair of conductive footprints patterned in the top metal layer and directly connected to the pair of pads in the top metal layer, respectively.

13. The electronic circuit of claim 10, wherein the first spark gap passes signals having a high frequency and high voltage, and does not pass signals having a low frequency and low voltage.

14. The electronic circuit of claim 13, wherein the signals having the high frequency and high voltage include an electrostatic discharge (ESD) strike and the signals having the low frequency and low voltage include signals from the switch.

15. The electronic circuit of claim 10, wherein the first spark gap is directly connected to the first resistor.

16. The electronic circuit of claim 11, wherein the first resistor is directly connected to at least one of the terminals of the switch.

17. The electronic circuit of claim 10, wherein the buffer circuit further transmits the processed signal to a processor or a system on a chip (SOC) that detects whether the switch is open or closed based on the processed signal.

18. An electronic circuit comprising:
a mechanical switch coupled to a physical button, the switch having a pair of terminals;
a first resistor being electrically coupled either in series or in parallel with the terminals of the switch;
a first spark gap coupled in parallel with the first resistor;
a DC power supply, wherein the first resistor is coupled to the power supply either in series between the power supply and the switch, or in parallel with the switch;
a second resistor being electrically coupled in series between the terminals of the switch and ground, wherein the first resistor is coupled in series between the power supply and the switch; and
a second spark gap coupled in parallel with the second resistor.

* * * * *